(12) United States Patent
Jennrich et al.

(10) Patent No.: US 8,343,270 B2
(45) Date of Patent: Jan. 1, 2013

(54) HARDENABLE REACTION RESIN SYSTEM

(75) Inventors: Irene Jennrich, Winnenden (DE); Kristian Leo, Burgstetten (DE); Markus Muzic, Murr (DE); Wolfgang Endres, Remshalden (DE); Marco Holst, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 1876 days.

(21) Appl. No.: 10/938,260

(22) Filed: Sep. 10, 2004

(65) Prior Publication Data

US 2005/0096423 A1    May 5, 2005

(30) Foreign Application Priority Data

Sep. 29, 2003 (DE) .................................. 103 45 139
Sep. 30, 2003 (DE) .................................. 103 45 312

(51) Int. Cl.
*C09D 5/00* (2006.01)
*C08L 101/12* (2006.01)
(52) U.S. Cl. ......... 106/287.35; 106/197.01; 106/287.13; 106/287.24
(58) Field of Classification Search ............. 106/197.01, 106/287.13, 287.24, 287.34, 287.35
See application file for complete search history.

(56) References Cited

U.S. PATENT DOCUMENTS

| | | | |
|---|---|---|---|
| 3,515,625 A | | 6/1970 | Sedlak et al. |
| 4,923,520 A | * | 5/1990 | Anzai et al. .................... 106/490 |
| 5,910,523 A | | 6/1999 | Hudson |
| 7,285,182 B2 | * | 10/2007 | Mason et al. ................. 162/135 |
| 2003/0083401 A1 | | 5/2003 | Schneider et al. |
| 2003/0114556 A1 | * | 6/2003 | Jennrich et al. ............... 523/400 |

FOREIGN PATENT DOCUMENTS

| | | | |
|---|---|---|---|
| DE | 101 44 871 | | 3/2003 |
| EP | 136 257 | | 1/1988 |
| EP | 426482 | | 3/1996 |
| WO | WO 97/39043 | | 10/1997 |
| WO | WO 03/078734 | * | 9/2003 |

OTHER PUBLICATIONS

Nanotechnology Handbook, Howakasa, Elsevier, 2007, p. 5.*
Merriam-Webster Online, Main Entry: nanoparticle, accessed Mar. 1, 2009.*

* cited by examiner

*Primary Examiner* — David M Brunsman
(74) *Attorney, Agent, or Firm* — Kenyon & Kenyon LLP

(57) ABSTRACT

A hardenable epoxy-free reaction resin system, in particular a casting compound, lacquer, laminating or impregnating resin, which contains an epoxy-free resin component, a mineral filler, and polymer particles dispersed in the resin component. The filler includes nanoparticles.

8 Claims, No Drawings

HARDENABLE REACTION RESIN SYSTEM

FIELD OF THE INVENTION

The present invention relates to an epoxy-free hardenable reaction resin system, a method for manufacturing same, as well as its use.

BACKGROUND INFORMATION

Systems based on a resin which hardens via a chemical reaction play a significant role in the manufacture of industrial components. When such reaction resin systems are used for insulation purposes, they usually have a high filler content. High filler contents result in a high thermal and mechanical resistance of the hardened reaction resin systems.

Such reaction resin systems are typically implemented as two-component systems, one component being a hardener, which is mixed with the other component containing reaction resins, fillers, etc., and immediately processed. This is disadvantageous because the preparation of the reaction resin system must be integrated into the processing stage, and storage for 3 to 12 months, for example, in a ready-to-use state at room temperature is impossible.

Another possibility is the use of one-component reaction resin systems. German Patent Application No. DE 101 44 871 describes one-component epoxy resin-based reaction resin systems. They contain up to 85 wt. % filler. Although higher filler contents are desirable because they result in a high thermal and mechanical resistance of the reaction resin system when hardened, they are impossible to implement in the systems described therein, because they would have a negative effect on the viscosity, i.e., processability of the casting compound. Another problem is represented by the physiological questionability of epoxy-containing systems, which require increased efforts to ensure adequate occupational safety in handling.

SUMMARY

An object of the present invention is to provide an epoxy-free hardenable reaction resin system which has a high thermal and mechanical resistance, yet is easy to process.

This object may be achieved by providing a reaction resin system in accordance with the present invention. The reaction system is usable as a one-component or two-component system and contains nanoparticles as a filler. By using nanoparticles as the filler, reaction resin systems having up to 90 wt. % filler content may be achieved, which are still castable and impregnatable. A system capable of withstanding high thermal and mechanical loads is provided in this manner. When hardened, the reaction resin system is characterized by a higher elongation at rupture, a low thermal expansion coefficient, high wear resistance, and high thermal conductivity.

Thus, it may be advantageous if the reaction resin system is implemented as a one-component system, because this makes simplified processing of same in the manufacturing process possible. Furthermore, the reaction resin system preferably has fused silica or silica flour particles as a filler, which result in a particularly pronounced thermal stability, a low expansion coefficient, and a low dielectric constant. Particularly advantageous is the use of surface-modified nanoparticles.

Another advantageous embodiment is characterized by the filler having particles of two different grain size distributions, one grain size distribution being in the nanometer range. In addition, it is advantageous if the reaction resin system has polymer particles in the form of silicone elastomer particles or elastomer particles of a polyester dispersed in the resin.

In a particularly advantageous embodiment, the reaction resin system has elastomer particles having a particle diameter of 10 nm to 100 µm dispersed in the resin component. The addition of elastomer particles as modifiers causes the reaction resin system to become brittle due to its high degree of cross-linking.

EXAMPLE EMBODIMENTS

A reaction resin system according to an example embodiment of the present invention has three basic components: a resin component A, a filler B, and polymer particles C, which are dispersed in resin component A. In addition, further components are provided such as one or more antifoaming agents, sedimentation inhibitors, or adhesion promoters.

In general, it should be kept in mind that the reaction resin system should form a stable system before and during processing to prevent the components from separating. Thus, filler particles B and polymer particles C should form stable dispersions with resin component A, and, if there are more resin components A, resin components A should form stable solutions or emulsions among themselves. This stability must be ensured during both processing and hardening of the reaction resin system.

Basically a plurality of monomers, cross-linkable compounds, or mixtures of such compounds may be used as resin component A. It may be particularly advantageous to use compounds forming polymers having amide or imide functionalities in the main polymer chain such as polyamides, polyimides, polyamide-imides, urea resins, melamine resins, cyanate esters, and/or polyurethanes. Cyanate esters are understood as polycondensates of organic dicyanates with monovalent or polyvalent alcohols.

Furthermore, compounds forming polymers with carboxylic acid ester functionalities in the main polymer chain such as alkydic resins, acrylates, polyesters, or polyesterimides, are suitable as resin component A. In addition, phenolic or silicone resins, cellulose derivatives, or vinylic or formaldehyde resins are suitable. Among phenolic resins, novolaks and resols are suitable in particular. Resin component A may include one or more of the above-named compounds or other resin components. Resin component A is contained in the reaction resin system in a proportion of 5% to 95 wt. %, preferably 10% to 60 wt. %, in particular 12% to 28 wt. %.

The reaction resin system also contains a filler B, which, if appropriately selected, reduces the shrinkage of the hardened reaction resin system and which increases the thermal stability, thermal conductivity, surface hardness, and tear resistance of the hardened reaction resin system. Filler B contains nanoparticles, nanoparticles being understood as a particle fraction whose mean grain size distribution $d_{50}$ is in the nanometer range. Quartz, alumina, chalk, silicon carbide, boron nitride, carbon black, and talcum, for example, are suitable as fillers. Filler B preferably has particles of silica flour or fused silica or mixtures of same. In a particularly preferred embodiment, filler B has particles of two different grain size distributions $d_{50}$. A first part of the filler particles is characterized by a grain size distribution in the nanometer range, and a second part of filler particles is preferably characterized by a grain size distribution $d_{50}$ in the micrometer range. Alternatively, filler B may also contain fibers, glass or carbon fibers, for example. This makes it possible to use the reaction resin system for the manufacture of sporting goods or circuit boards.

By using nanoparticles, the overall proportion of filler B in the reaction resin system may be increased to 90 wt. %, the reaction resin system still remaining sufficiently fluid during processing and hardening. The total filler content in the reaction resin system may thus equal 2% to 90 wt. %, preferably 2% to 70 wt. %, in particular 2% to 25 wt. %.

The use of silanized filler particles has been found to be particularly suitable, because the modification of the filler particle surfaces ensures improved bonding of filler B to resin matrix A of the reaction resin system. To be able to set the degree of silanization of filler B, either the filler is previously treated with a silanizing agent and the presilanized filler is mixed into the reaction resin system, or the silanizing agent is added to the reaction resin system and the actual silanization reaction takes place in the reaction resin system. Alternatively, filler B may also have a chemically modified surface in the form of a polymer layer, PE or PP, for example.

The reaction resin system also contains polymer particles dispersed in resin component A as third component C. These are elastomer particles in particular, polysiloxane-containing elastomer particles or silicone particles, elastomer particles of a polyester or elastomer particles of an acrylonitryl-butadiene-styrene copolymerizate (ABS) being preferred. Component C preferably represents a dispersion of elastomer particles in resin component A. The elastomer particles preferably have a particle diameter of 10 nm to 100 µm.

The silicone particles may also have a chemically modified surface in the form of a polymer layer, of PMMA, for example.

The reaction resin system contains up to 25 wt. %, preferably up to 10 wt. % of polymer particles C.

To ensure that the reaction resin system as a one-component system is processable, an initiator D is provided, for example, as a fourth component which makes a sufficiently quick reaction at a higher temperature possible. Such initiators include, for example, cationic initiators such as iodonium, boron-iodonium, or chinolinium compounds. Furthermore, peroxide compounds having unstable carbon-carbon bonds, Octoate® (a zinc diethylhexoate-based rubber activator) or organometallic compounds based on zirconium, lead, cobalt, manganese, or chromium, as well as ethylhexanoate, are suitable.

In addition, the initiator may contain a co-catalyst, which is used mainly for lowering the reaction start temperature. This co-catalyst may be a radical former such as benzopinacol. The selection of the initiator essentially determines the course of the hardening reaction. The combination of a cationic cross-linking agent with a co-catalyst results in a suitable reaction rate profile, which is characterized by an optimum reaction temperature to be narrowly delimited, at which the reaction progresses rapidly, without a sluggish reaction already taking place at lower temperatures such as room temperature. This is also a prerequisite for the storability of the one-component system at room temperature.

Another possibility is forming the reaction resin system as a two-component system. In this case, the first component is made up of the initiator mixed with resin component A and optionally the mineral filler (B) and/or the polymer particles (C) dispersed in the resin component (A), and the second component is made up of a co-catalyst mixed with resin component A and optionally with the mineral filler (B) and/or the polymer particles (C) dispersed in the resin component (A)

The present reaction resin system may be used as an impregnating resin, lacquer, or as a casting compound, for example. Processing usually takes place at a higher temperature. When the reaction resin system is heated to the appropriate temperature, it has such a low viscosity and such a high capillary effect that it may be cast even into unfavorable geometries, such as casting gaps having a diameter of <300 µm. This makes very short cycle times possible at the same time. The reaction resin system is cross-linked at temperatures between 15° and 280° C.

For processing as an impregnating resin, for impregnating electrical windings, for example, the reaction resin system is preferably diluted using a solvent, styrene, for example, the winding to be impregnated is rotated, and either immersed into the liquid impregnating resin or the liquid impregnating resin is dripped onto the rotating winding. The impregnated winding is hardened thermally, for example, or via UV-supported cross-linking.

When processing the reaction resin as a lacquer, solvents are added to the reaction resin system. These may be the customary lacquer solvents such as toluene, xylene, etc.

Depending on its polymer basis, the unhardened reaction resin system is also suitable for components exposed to temperatures up to 300° C., at least from time to time, for wire lacquers, for example.

The reaction resin system according to the present invention thus may be preferably used for casting electrical or electronic components such as diodes or ignition coils. Furthermore, electrical windings may be impregnated using the reaction resin system or conductor wires may be lacquered, and circuit boards and other laminates such as sporting goods, for example, may be manufactured.

What is claimed is:

1. A hardenable epoxy-free reaction resin system, comprising:
    an epoxy-free resin component;
    a mineral filler; and
    polymer particles dispersed in the resin component;
    wherein the filler includes nanoparticles,
    wherein the polymer particles dispersed in the resin component are one of silicone elastomer particles or elastomer particles of a polyester.

2. The reaction resin system as recited in claim 1, wherein the resin system is one of a casting compound, a lacquer, a laminating resin or an impregnating resin.

3. The reaction resin system as recited in claim 1, wherein the system is processed as a one-component system.

4. The reaction resin system as recited in claim 1, wherein the filler includes one of silica flour or fused silica flour.

5. The reaction resin system as recited in claim 1, wherein the filler includes surface-modified nanoparticles.

6. The reaction resin system as recited in claim 1, wherein the filler has particles of two different grain size distributions, one grain size distribution being in the nanometer range.

7. The reaction resin system as recited in claim 1, wherein the resin component includes at least one of a silicone resin, a cellulose derivative, a vinylic resin, a phenolic resin, and a formaldehyde resin.

8. The reaction resin system as recited in claim 7, wherein the polymer particles have a particle diameter of 10 nm to 100 µm.

* * * * *